(12) United States Patent
Hayashi et al.

(10) Patent No.: US 6,800,524 B2
(45) Date of Patent: Oct. 5, 2004

(54) METHOD OF MANUFACTURING SEMICONDUCTOR INTEGRATED CIRCUIT DEVICE

(75) Inventors: Mitsuaki Hayashi, Kyoto (JP); Shuji Nakaya, Kobe (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 40 days.

(21) Appl. No.: 10/420,919

(22) Filed: Apr. 23, 2003

(65) Prior Publication Data

US 2003/0219946 A1 Nov. 27, 2003

(30) Foreign Application Priority Data

May 22, 2002 (JP) ........................................ 2002-147878

(51) Int. Cl.⁷ .............................................. H01L 21/336
(52) U.S. Cl. .................... 438/257; 438/258; 365/185.24
(58) Field of Search ................................. 438/257, 258

(56) References Cited

U.S. PATENT DOCUMENTS

| | | | | | |
|---|---|---|---|---|---|
| 4,939,568 A | * | 7/1990 | Kato et al. | .................. | 257/686 |
| 6,049,482 A | * | 4/2000 | Aritome et al. | ......... | 365/185.24 |
| 6,147,912 A | * | 11/2000 | Kitazawa | ............... | 365/189.02 |
| 6,181,590 B1 | * | 1/2001 | Yamane et al. | ............. | 363/132 |
| 6,377,501 B2 | * | 4/2002 | Maesako et al. | ....... | 365/230.03 |

* cited by examiner

Primary Examiner—David Nelms
Assistant Examiner—Thao P. Le
(74) Attorney, Agent, or Firm—Stevens, Davis, Miller & Mosher, LLP.

(57) ABSTRACT

The object of the present invention is directed to shorten a manufacturing TAT when changing a stored data of a mask ROM incorporated into a semiconductor integrated circuit device with multi-layered structure, and to improve a manufacturing yield. For example, when the semiconductor integrated circuit device comprising an interconnection layer with five layers are manufactured, when fabricating samples or prototypes where data to be written to the mask ROM is frequently changed, the manufacturing TAT is shortened by means of configuring a bit line as a fifth layer of metal interconnection layer of an uppermost layer, and an interlayer dielectric (ILD) layer just below it as a forming layer of a via hole for use in data writing. During the manufacture of mass-produced products after determining the ROM data, it is possible to decrease the number of layers for configuring the memory cell by means of forming the bit line by the first metal interconnection layer of a lowermost layer, and configuring the ILD layer just below it as a forming layer of the via hole for use in data writing, to improve the manufacturing yield by reducing manufacturing process steps of the memory cell.

7 Claims, 5 Drawing Sheets

METHOD OF MANUFACTURING SEMICONDUCTOR INTEGRATED CIRCUIT DEVICE

BACKGROUND OF THE INVENTION

1. Field of the Invention

The present invention relates to a method of manufacturing a semiconductor integrated circuit device incorporating an on-chip ROM to which data is written during a manufacturing process.

2. Description of Conventional Embodiment

FIG. 4 is a block diagram showing a semiconductor integrated circuit device, and includes a mask ROM 1, and a block 2, a block 3 and a block 4 having arbitrary functions. In addition, in this conventional example, it is assumed that the semiconductor integrated circuit device has five metal interconnection layers.

FIG. 5A is a top view of a memory cell of the mask ROM 1 configuring the semiconductor integrated circuit device of FIG. 4, and FIG. 5B is a sectional drawing taken on a chain line E—E of FIG. 5A.

In FIG. 5A and FIG. 5B, SUB is a semiconductor substrate on which the mask ROM 1 and the blocks 2–4 in FIG. 4 are formed, G is a gate of an N-channel transistor which is a memory cell transistor, D is a drain of the N-channel transistor, S is a source of the N-channel transistor, Z1, Z2, Z3, Z4, Z5 are a first, a second, a third, a fourth, a fifth layers of interlayer dielectric (hereinafter referred to as ILD) layers, V1, V2, V3, V4, V5 are via holes formed in the ILD layers Z1, Z2, Z3, Z4, Z5, respectively, and M1,M2,M3, M4,M5 are a first, a second, a third, a fourth, a fifth layer of metal interconnection layers. Pads are formed by the metal interconnection layers M1, M2, M3, and M4 herein and a bit line is formed by the metal interconnection layer M5. Hereinafter, M1,M2,M3, and M4 are also referred to as pads and M5, as a bit line. U-BIT and B-BIT show memory cell regions, each of which is 1 bit. The drain D is connected to the bit line M5 through the metal pads M1, M2, M3, and M4, and the via holes V1, V2, V3, V4, V5.

A description will be made of the memory cell of the mask ROM in the semiconductor integrated circuit device configured as above.

The mask ROM makes "discharging" or "not discharging" an electric charge stored in the bit line through the transistor arranged in each bit correspond to "0" and "1" of stored data, respectively, and determines "discharging" or "not discharging" by "connecting" or "not connecting" the bit line to the transistor of each bit in manufacturing steps, respectively.

In addition, because data writing of the mask ROM is performed in the manufacturing steps, and it is strongly required from the market to deal, for a short period, with data changes etc. caused by specification changes or the like of the semiconductor integrated circuit device, it is also necessary to form the mask ROM by interconnection layers of the memory cell equivalent to the interconnection layers of the other blocks 2, 3, and 4 of the semiconductor integrated circuit device, and to write the memory data in an upper layer as much as possible.

In order to satisfy these requirements, the memory cell of the conventional mask ROM is configured using the same five interconnection layers M1–M5 as the other blocks 2, 3, and 4 of the semiconductor integrated circuit device in FIG. 4, a fifth layer of the uppermost layer is configured to be the bit line, in the manufacturing process of forming the via hole V5 in the uppermost layer for connecting the bit line M5 to the drain D, the state of "connecting" or "not connecting" the bit line to the transistor of each bit is created by "forming" or "not forming", and is made to correspond to "0" or "1" of each stored data.

The conventional semiconductor integrated circuit device described above has the following problems.

In recent years, while the semiconductor integrated circuit device is being multi-layered, in order to shorten a manufacturing TAT (Turn Around Time) when changing the data to be stored, it is also necessary for the memory cell of the mask ROM in the semiconductor integrated circuit device to be multi-layered, and since the more multi-layered, the more the manufacturing process of the memory cell increases, the probability of occurrence of failures increases, resulting in decreasing yield of the semiconductor integrated circuit device.

BRIEF DESCRIPTION OF THE INVENTION

The present invention is to resolve the problems in a conventional semiconductor integrated circuit device described above, and the object is to provide a method of manufacturing the semiconductor integrated circuit device capable of shortening a manufacturing TAT when changing data to be stored in a mask ROM, and increase a manufacturing yield.

According to the present invention, in the method of manufacturing the semiconductor integrated circuit device, a mask ROM cell array portion is provided in a predetermined region of the semiconductor substrate, on the surface of which a plurality of insulating layers and interconnection layers are alternately stacked, respectively, the mask ROM cell array portion comprises, a plurality of memory cell transistors formed in a predetermined region of the semiconductor substrate lower than the insulating layers and the interconnection layers, and a bit line formed by a predetermined interconnection layer among the interconnection layers, wherein when a first data is written to each of the memory cell transistors, the bit line and the memory cell transistors are made to be in an electrically connected state through a via hole for use in data writing by forming the via hole for use in data writing in the insulating layer just below the bit line, and when a second data is written, the bit line and the memory cell transistor are made to be in an electrically disconnected state by not forming a via hole for use in data writing, and wherein, during the fabrication of samples or prototypes of the semiconductor integrated circuit device, the bit line is formed by a first interconnection layer upper than a lowermost layer among a plurality of interconnection layers, and during the manufacture of mass-produced products of the semiconductor integrated circuit device, the bit line is formed by a second interconnection layer lower than the first interconnection layer among the plurality of interconnection layers.

In accordance with this manufacturing method, when fabricating the samples or the prototypes where data writing to the mask ROM of the semiconductor integrated circuit device is frequently changed, by means of forming the bit line by an upper interconnection layer, and configuring the insulating layer just below it as a forming layer of the via hole for use in data writing, the manufacturing TAT of the semiconductor integrated circuit device is shortened, while when manufacturing mass-produced products after ROM data is determined, by means of forming the bit line by a lower interconnection layer and configuring an insulating layer just below it as a forming layer of the via hole for use in data writing, it is possible to decrease manufacturing process steps of the memory cell by reducing the number of the layers configuring the memory cell, and to improve a manufacturing yield of the semiconductor integrated circuit device.

In this case, when manufacturing mass-produced products, the via hole may not be formed in the insulating layer just above the bit line over the region of the mask ROM cell array portion, or the via hole may not be formed in the insulating layer upper than the bit line over the region of the mask ROM cell array portion, either. Alternatively, the interconnection layers upper than the bit line may not be formed over the region of the mask ROM cell array portion, and the via hole may not be formed in the insulating layer upper than the bit line, either.

In addition, in accordance with an aspect of the present invention, when manufacturing mass-produced products, as a mask pattern for a mask used for forming the via hole for use in data writing, using substantially the same mask pattern as the mask pattern used for forming the via hole for use in data writing of the samples or the prototypes, without generating different mask layouts for the via hole for use in data writing when fabricating the samples or the prototypes and manufacturing the mass-produced products, it is possible to automatically generate the mask pattern for the mask used during the manufacture of the mass-produced products by a mask data operation.

In addition, when manufacturing the mass-produced products, as a mask pattern of a mask used for forming the bit line, by using substantially the same mask pattern as a mask pattern used for forming the bit line of the samples or the prototypes, without generating different mask layouts for the bit line when fabricating the samples or the prototypes and manufacturing the mass-produced products, it is possible to automatically generate the mask pattern for the mask used during the manufacture of the mass-produced products by the mask data operation.

DESCRIPTION OF PREFERRED EMBODIMENT

Similar to a case of a conventional embodiment described above, in a mask ROM incorporated into a semiconductor integrated circuit device according to a first to a third embodiments described hereinafter, a plurality of word lines and a plurality of bit lines are intersectionlly arranged, and a memory cell transistor has a gate which is connected to the word line, a source which is grounded, and a drain which is connected or disconnected to the bit line. Connection or disconnection between the drain and the bit line is achieved by forming or not forming the via hole for use in data writing. By selecting an arbitrary bit line and an arbitrary word line, data of the memory cell at its intersection is then read through the bit line.

(First Embodiment)

Figure 4:
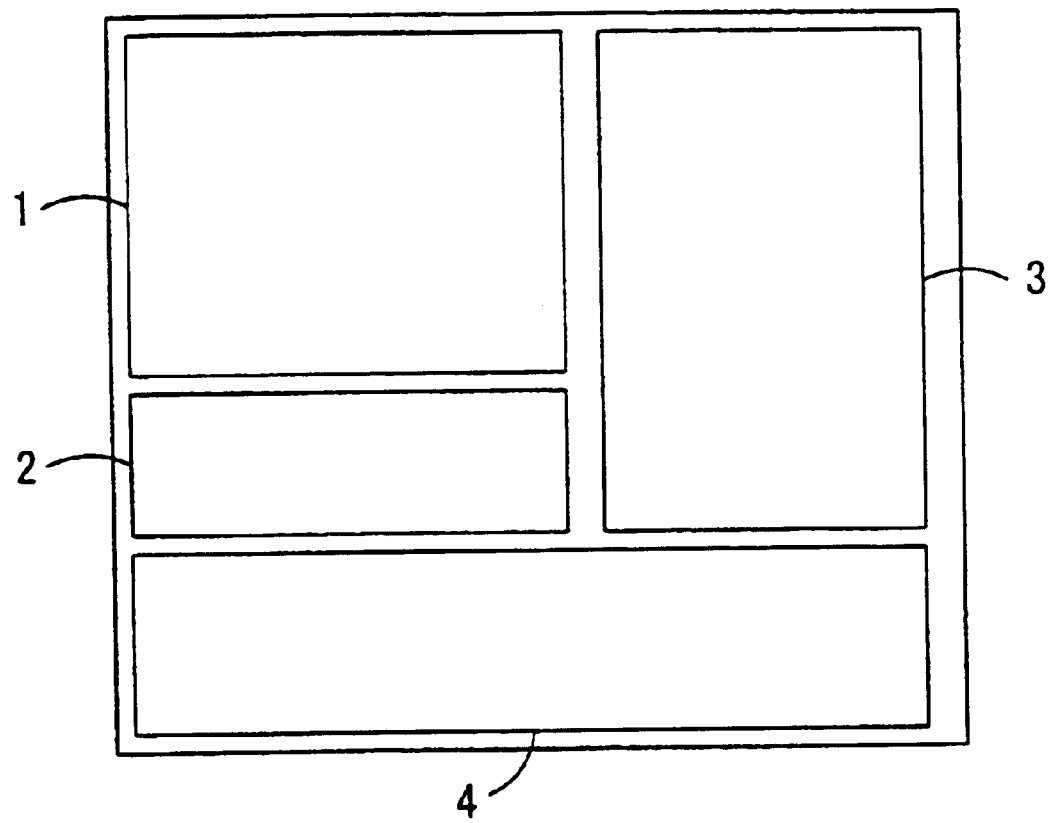
FIG. 4 is a block diagram of a semiconductor integrated circuit device.

A semiconductor integrated circuit device of the present embodiment is also shown in a block diagram of FIG. 4 the same as in the conventional example, and blocks 2–4 that are circuit portions other than a mask ROM 1 have multilayered interconnection constructions having a 1st to a 5th layer of metal interconnection layers M1–M5.

Generally, during the initial fabrication stage where data to be written to a ROM is frequently changed, that is, during the fabrication of samples or prototypes (hereinafter referred to as samples or the like), production quantity of the semiconductor integrated circuit device is small, and during the manufacture of mass-produced products after determining the data, the production quantity is significantly increased. Thus, in the present embodiment, when fabricating the samples or the like whose data is frequently changed, the production TAT is shortened by producing the semiconductor integrated circuit device comprising the mask ROM with the memory cell structures shown in FIG. 5A and FIG. 5B, and when manufacturing the mass-produced products after the data is determined, a yield can be improved by manufacturing the semiconductor integrated circuit device comprising the mask ROM of the memory cell structure shown in FIG. 1A and FIG. 1B. Incidentally, in the case of the conventional example, devices with the same structure have been produced during the fabrication of the samples or the like as well as during the manufacture of the produced products after the ROM data has been determined.

Figure 1A:
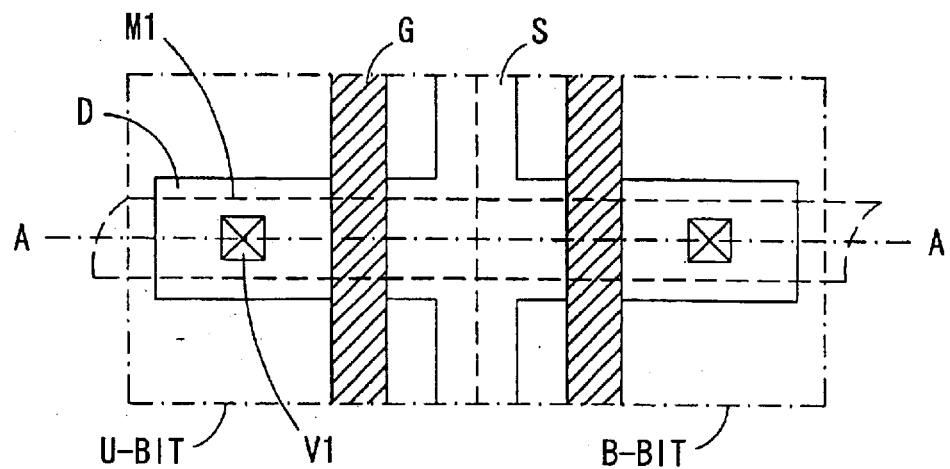
FIG. 1A is a top view of a memory cell of a mask ROM when manufacturing mass-produced products of a semiconductor integrated circuit device according to a first embodiment of the present invention.
Figure 1B:
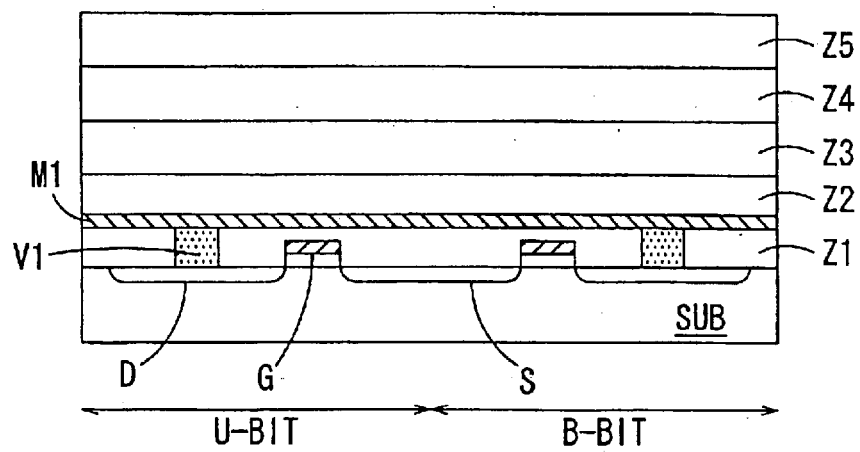
FIG. 1B is a sectional drawing taken on a chain line A—A of FIG. 1A.

FIG. 1A is a top view of a memory cell of a mask ROM when manufacturing the mass-produced products of the semiconductor integrated circuit device according to the present embodiment, and FIG. 1B is sectional drawing taken on a chain line A—A of FIG. 1A.

In FIG. 1A and FIG. 1B, SUB is a semiconductor substrate on which the mask ROM 1 and the blocks 2–4 in FIG. 4 are formed, G is a gate of an N-channel transistor which is a memory cell transistor, D is a drain of the N-channel transistor, S is a source of the N-channel transistor, Z1, Z2, Z3, Z4, Z5 are a first, a second, a third, a fourth, and a fifth layer of interlayer dielectric (hereinafter referred to as ILD) layers, V1 is a via hole formed in a first ILD layer Z1, and M1 is a first metal interconnection layer. The metal interconnection layer M1 herein forms a bit line. Hereinafter, M1 is also referred to as a bit line. U-BIT and B-BIT show memory cell regions, each of which is 1 bit.

In accordance with the present embodiment, data writing to the memory cell of the mask ROM shown in FIG. 1A and FIG. 1B is performed by forming or not forming the via hole V1 for connecting the bit line M1 to the drain D in the manufacturing process. A state of connecting or not connecting the bit line to the transistor of each bit is created by forming or not forming the via hole V1, and is made to correspond to "0" or "1" of each stored data.

In accordance with this configuration, by configuring the bit line by the first metal interconnection layer M1 and configuring the ILD layer Z1 just below it as a forming layer of the via hole V1 for use in data writing, it is possible to eliminate the number of layers configuring the memory cell (the number of these layers does not include ILD layers Z2–Z5), and to reduce manufacturing process steps of the memory cell. It is therefore possible to reduce a probability of occurrence of failures and to increase the yield of the semiconductor integrated circuit device.

In addition, in generation (design) of the mask ROM cell array portion of the mask ROM according to the first embodiment, it is possible to easily convert masks (masks when ROM data is determined) used during the fabrication of the samples or the like to masks used during the manufacture of the mass-produced products, by setting V5=V1, M5=M1 as a layer conversion in a mask data operation and eliminating via holes V2–V5 and metal interconnection layers M2–M5. By this method, it is possible to automatically generate the mask pattern for the mask used in manufacturing the mass-produced products by this mask data operation without generating different mask layouts when fabricating the samples or the like and when manufacturing the mass-produced products.

(Second Embodiment)

A semiconductor integrated circuit device of the present embodiment is also shown in a block diagram of FIG. 4 the same as in the conventional example, and blocks 2–4 have multilayered interconnection constructions having a first to a fifth layer of metal interconnection layers M1–M5.

Figure 2A:
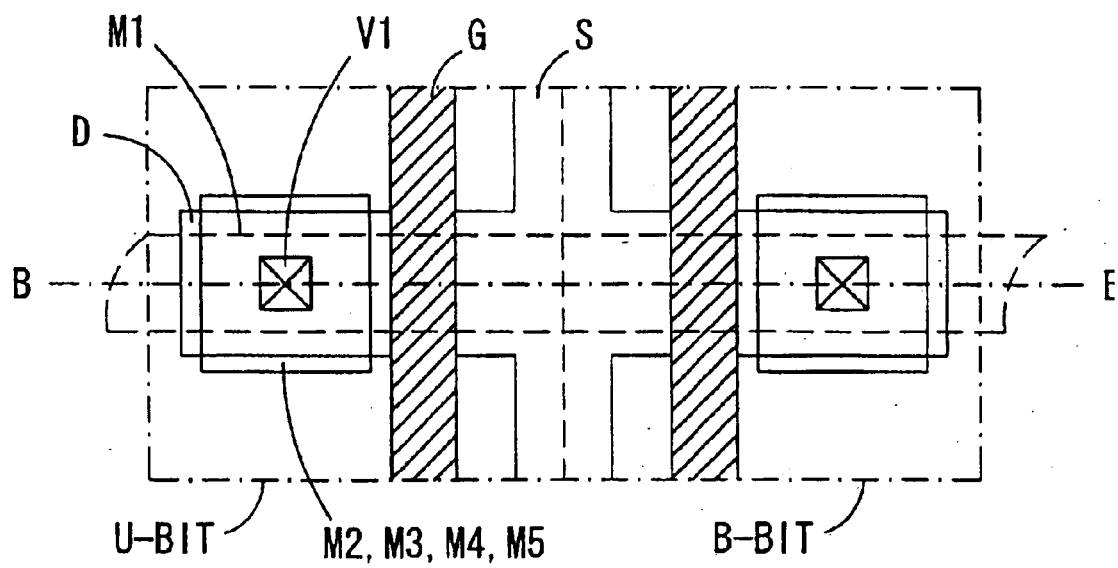
FIG. 2A is a top view of a memory cell of a mask ROM when manufacturing mass-produced products of a semiconductor integrated circuit device according to a second embodiment of the present invention.
Figure 2B:
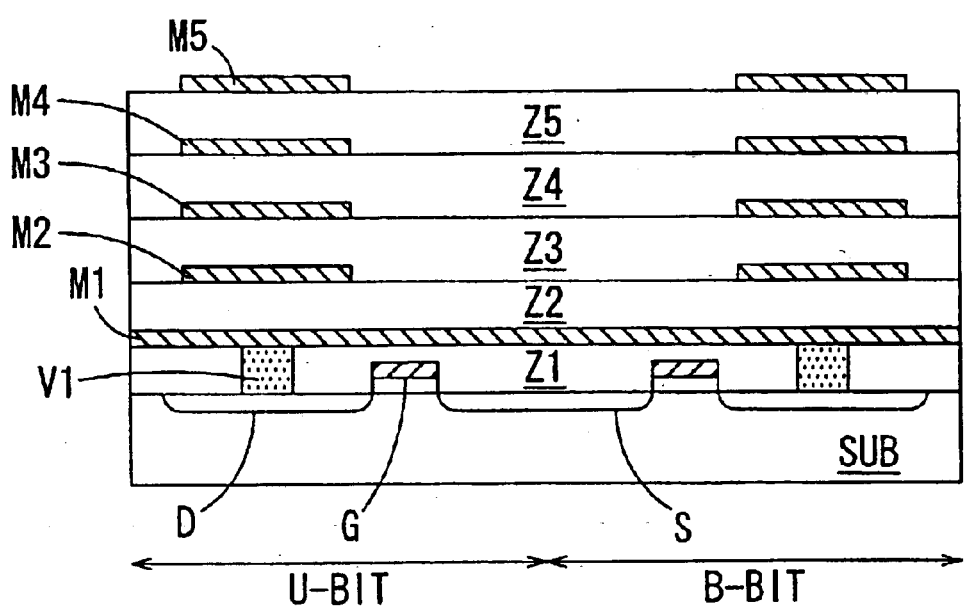
FIG. 2B is a sectional drawing taken on a chain line B—B of FIG. 2A.
Figure 5A:
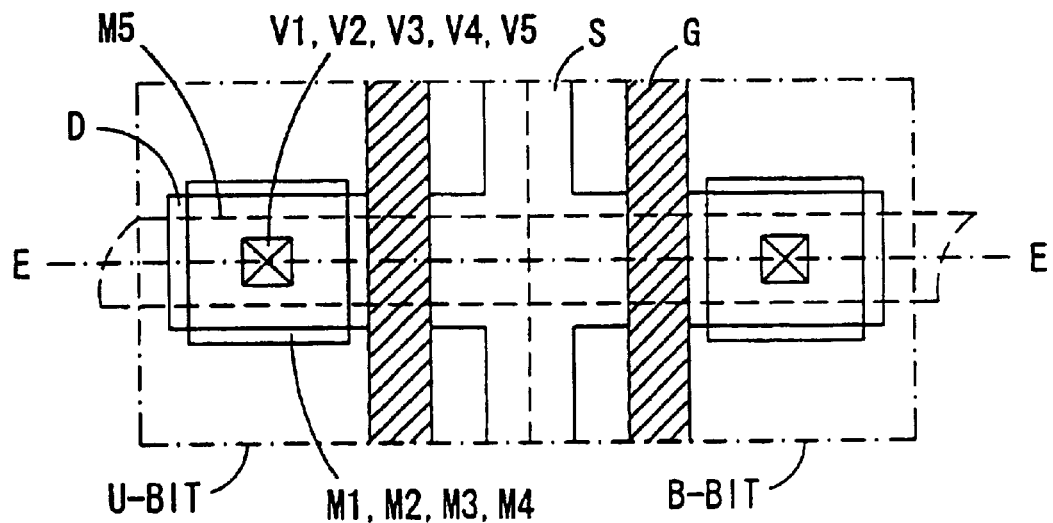
FIG. 5A is a top view of a memory cell of a mask ROM when fabricating the samples or the like whose data is frequently changed.
Figure 5B:
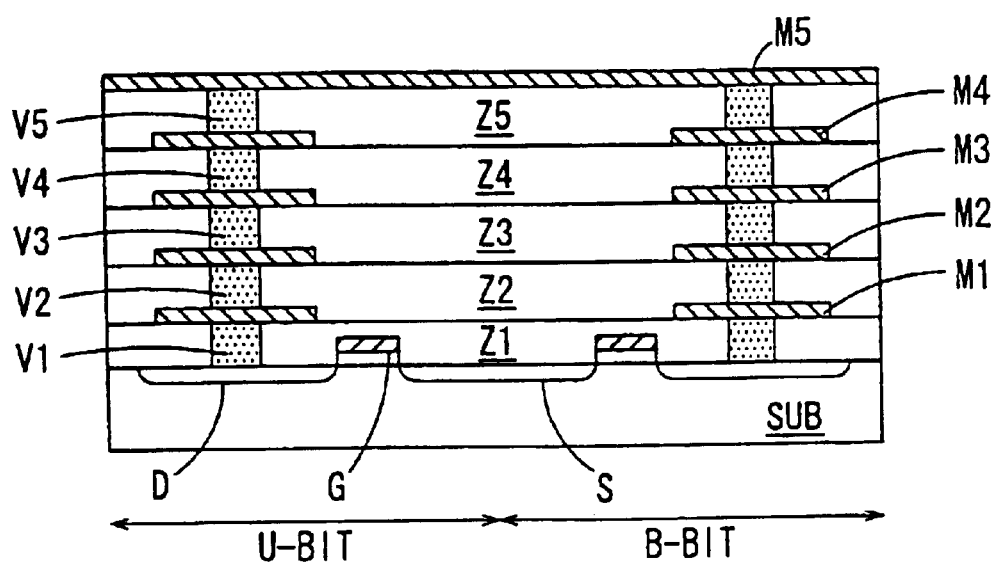
FIG. 5B is a sectional drawing taken on a chain line E—E of FIG. 5A.

According to the present embodiment which is similar to the first embodiment, in an initial fabrication stage where data to be written to a ROM is frequently changed, that is, when fabricating samples or the like, the production TAT is shortened by manufacturing the semiconductor integrated circuit device comprising a mask ROM with a memory cell structure shown in FIG. 5A and FIG. 5B, and when manufacturing the mass-produced products after determining the data, the yield can be improved by manufacturing the semiconductor integrated circuit device comprising the mask ROM of the memory cell structure shown in FIG. 2A and FIG. 2B.

FIG. 2A is a top view of a memory cell of the mask ROM when manufacturing the mass-produced products of the semiconductor integrated circuit device according to the present embodiment, and FIG. 2B is a sectional drawing taken on a chain line B—B of FIG. 2A.

In FIG. 2A and FIG. 2B, SUB is a semiconductor substrate on which a mask ROM 1 and blocks 2–4 are formed, G is a gate of an N-channel transistor which is a memory cell transistor, D is a drain of the N-channel transistor, S is a source of the N-channel transistor, Z1, Z2, Z3, Z4, Z5 are a first, a second, a third, a fourth, and a fifth layer of ILD layers, V1 is a via hole formed in a first ILD layer Z1, and M1,M2,M3,M4,M5 are a first, a second, a third, a fourth, a fifth layer of metal interconnection layers. The metal interconnection layer M1 is herein a bit line and the metal interconnection layers M2, M3, M4, and M5 are metallic interconnections. Hereinafter, M1 is also referred to as a bit line, and M2, M3, M4, and M5, as metal interconnections. U-BIT and B-BIT show memory cell regions, each of which is 1 bit.

In accordance with the present embodiment, data writing to the memory cell of the mask ROM shown in FIG. 2A and FIG. 2B is performed by forming or not forming the via hole V1 for connecting the bit line M1 to the drain D in the manufacturing process. A state of connecting or not connecting the bit line to the transistor of each bit is created by forming or not forming the via hole V1, and is made to correspond to "0" or "1" of each stored data.

In accordance with this configuration, by configuring the bit line by the first metal interconnection layer M1 and configuring the ILD layer Z1 just below it as a forming layer of the via hole V1 for use in data writing, it is possible to eliminate the number of layers configuring the memory cell (the number of these layers does not include ILD layers Z2–Z5 and the metal interconnection layers M2–M5), and to reduce the manufacturing process steps of the memory cell. It is therefore possible to reduce a probability of occurrence of failures and to increase the yield of the semiconductor integrated circuit device.

Moreover, by arranging the metal interconnections M2–M5 with an arbitrary pattern, it is possible to eliminate differences in heights of ILD layers Z1–Z5 generated in the adjacent portion between the mask ROM 1, and the blocks 2 and 3 in FIG. 4, to reduce a probability of occurrence of failures such as a broken wire of the interconnection layer near said adjacent portion, and then to further improve the yield of the semiconductor integrated circuit device.

(Third Embodiment)

A semiconductor integrated circuit device in accordance with the present embodiment is also shown in a block diagram of FIG. 4 the same as a conventional example, and blocks 2–4 have multi-layered interconnection constructions having a first to a fifth layer of metal interconnection layers M1–M5.

Figure 3A:
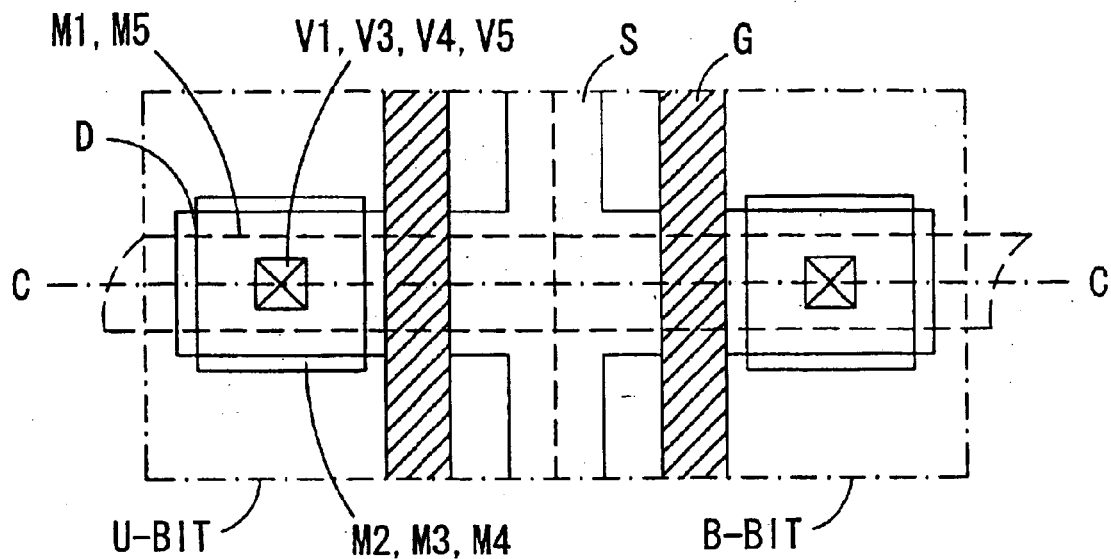
FIG. 3A is a top view of a memory cell of a mask ROM when manufacturing mass-produced products of a semiconductor integrated circuit device according to a third embodiment of the present invention.
Figure 3B:
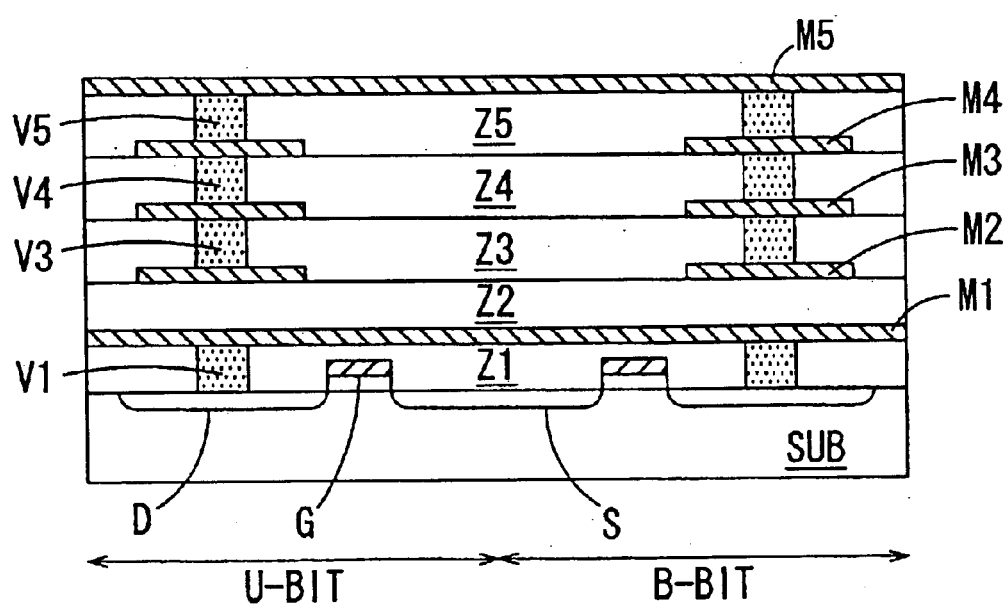
FIG. 3B is sectional drawing taken on a chain line C—C of FIG. 3A.

According to the present embodiment similar to the first embodiment, in the initial fabrication stage where data to be written to a ROM is frequently changed, that is, during the fabrication of the samples or the like, the production TAT is shortened by producing the semiconductor integrated circuit device comprising a mask ROM with a memory cell structure shown in FIG. 5A and FIG. 5B, and during the manufacture of the mass-produced products after determining the data, the yield can be improved by manufacturing the semiconductor integrated circuit device comprising the mask ROM of the memory cell structure shown in FIG. 3A and FIG. 3B.

FIG. 3A is a top view of a memory cell of the mask ROM when manufacturing mass-produced products of the semiconductor integrated circuit device in accordance with the present embodiment, and FIG. 3B is a sectional drawing taken on a chain line C—C of FIG. 3A.

In FIG. 3A and FIG. 3B, SUB is a semiconductor substrate on which the mask ROM 1 and blocks 2–4 are formed shown in FIG. 4, G is a gate of an N-channel transistor which is a memory cell transistor, D is a drain of the N-channel transistor, S is a source of the N-channel transistor, Z1, Z2, Z3, Z4, Z5 are a first, a second, a third, a fourth, and a fifth layer of ILD layers, V1, V3, V4, and V5 are via holes formed in each ILD layers Z1, Z3, Z4, and Z5, and M1,M2,M3, M4,M5 are a first, a second, a third, a fourth, a fifth layer of metal interconnection layers. The metal interconnection layer M1 is herein referred to as a bit line, the metal interconnection layers M2, M3, M4, as metallic pads, and the metal interconnection layer M5, as a metallic interconnection. Hereinafter, M1 is also referred to as a bit line, and M2, M3, M4, as pads, and M5, as a metal interconnection. U-BIT and B-BIT show memory cell regions, each of which is 1 bit.

In accordance with the present embodiment, data writing to the memory cell of the mask ROM shown in FIG. 3A and FIG. 3B is performed by forming or not forming the via hole V1 for connecting the bit line M1 to the drain D in the manufacturing process. A state of connecting or not connecting the bit line to the transistor of each bit is created by forming or not forming the via hole V1, and is made to correspond to "0" or "1" of each stored data.

In accordance with this configuration, by configuring the bit line by the first metal interconnection layer M1, and the ILD layer Z1 just below it as a forming layer of the via hole V1 for use in data writing, it is possible to eliminate the number of layers configuring the memory cell (the number of these layers does not include the ILD layers Z2–Z5, the via holes V3–V5, and the metal interconnection layers M2–M5), and to reduce the manufacturing process steps of the memory cell. It is therefore possible to reduce the probability of occurrence of failures and to increase the yield of the semiconductor integrated circuit device.

In addition, in generation (design) of a mask ROM cell array portion of the mask ROM according to a third embodiment, it is possible to easily convert masks (masks when ROM data is determined) used during the fabrication of the samples or the like to masks used during the manufacture of the mass-produced products, by setting V5=V1, M5=M1 as a layer conversion in a mask data operation and eliminating the via holes V2. By this method, it is possible to automatically generate a mask pattern for the mask used during the manufacture of the mass-produced products by this mask data operation without generating different mask layouts for the fabrication of the samples or the like, and for the manufacture of the production products.

Herein, in the configuration for manufacturing the mass-produced products shown in FIG. 3A and FIG. 3B, the via holes V3–V5, the pads M2, M3, and M4, and the interconnection M5 formed upper than the bit line M1 will functionally become unnecessary.

In addition, among the masks used during the manufacture of the mass-produced products, only the masks of the metal interconnection layer M1, and those of the via holes V1 and V2 will be changed relative to the masks used during the fabrication of the samples or the like (masks when determining the ROM data), and only a few mask changes need to be done compared to the first embodiment.

As described above, in accordance with the first, the second and the third embodiments, when fabricating the samples or the like whose data to be written to the ROM is frequently changed, by configuring the bit line as the fifth layer of metal interconnection layer M5 of the uppermost layer as shown in FIG. 5A and FIG. 5B, and the ILD layer Z5 just below it as the forming layer of the via hole V5 for use in data writing, it is possible to shorten the manufacturing TAT of the semiconductor integrated circuit device. In addition, during the manufacture of the mass-produced products after determining the ROM data, by configuring the bit line as the first metal interconnection layer M1 of the lowermost layer, and the ILD layer Z1 just below it as the forming layer of the via hole V1 for data writing, it is possible to decrease the manufacturing process steps of the memory cell by reducing the number of the layers configuring the memory cell, and to improve the manufacturing yield of the semiconductor integrated circuit device.

Incidentally, although the bit line is formed by the fifth layer of metal interconnection layer M5 of the uppermost layer during the fabrication of the samples or the like according to the first, the second, and the third embodiments, the present invention is not limited to this configuration. The bit line may be formed by the interconnection layer upper than the first metal interconnection layer M1 which is the lowermost layer. It is possible to further shorten the manufacturing TAT of the semiconductor integrated circuit device by means of configuring the bit line as the more upper interconnection layer as shown in the first, the second, and the third embodiments.

In addition, according to the first, the second, and the third embodiments, during the manufacture of the mass-produced products, although the bit line is formed by the first metal interconnection layer M1 of the lowermost layer, the present invention is not limited to this configuration. The bit line may be formed by an interconnection layer lower than the interconnection layer used as the bit line during the fabrication of the samples or the like, and it is possible to configure the ILD layer just below the bit line as the forming layer of the via holes for use in ROM data writing. For example, in forming the bit line by the third metal interconnection layer M3, the data is written by forming or not forming the via hole V3 for connecting the bit line (M3) to the pad (M2) in the ILD layer Z3. It is possible to decrease the number of layers configuring the memory cell, to decrease the manufacturing process steps of the memory cell, and to further improve the manufacturing yield of the semiconductor integrated circuit device by configuring the bit line as lower interconnection layer as described in the first, the second and the third embodiments.

In addition, according to the first, the second, and the third embodiments, although a description is made of a case where the metal interconnection layer of the semiconductor integrated circuit device consists of five layers, if it has a plurality of layers, not limited to five layers, it can similarly be applied.

What is claimed is:

1. A method of manufacturing a semiconductor integrated circuit device, comprising:

a mask ROM cell array portion, being provided in a predetermined region of a semiconductor substrate, on the surface of which a plurality of insulating layers and interconnection layers are alternately stacked, respectively, wherein said mask ROM cell array portion comprises a plurality of memory cell transistors formed in a predetermined region of said semiconductor substrate lower than said insulating layers and said interconnection layers, and a bit line formed by a predetermined interconnection layer among said interconnection layers, and wherein when a first data is written to each of said memory cell transistors, said bit line and said memory cell transistor are made to be in an electrically connected state through a via hole for use in data writing by forming said via hole for use in data writing in an insulating layer just below said bit line, and when a second data is written, said bit line and said memory cell transistor are made to be in an electrically disconnected state by not forming said via hole for use in data writing, and wherein during the fabrication of samples or prototypes of said semiconductor integrated circuit device, said bit line is formed by a first interconnection layer upper than a lowermost layer among said plurality of interconnection layers, and during the manufacture of mass-produced products of said semiconductor integrated circuit device, said bit line is formed by a second interconnection layer lower than said first interconnection layer among said plurality of interconnection layers.

2. The method of manufacturing the semiconductor integrated circuit device according to claim 1, wherein during the manufacture of said mass-produced products, a via hole is not formed in an insulating layer just above said bit line over a region of said mask ROM cell array portion.

3. The method of manufacturing the semiconductor integrated circuit device according to claim 1, wherein during the manufacture of said mass-produced products,
a via hole is not formed in an insulating layer upper than said bit line over a region of said mask ROM cell array portion.

4. The method of manufacturing the semiconductor integrated circuit device according to claim 1, wherein during the manufacture of said mass-produced products, interconnection layers upper than said bit line are not formed over the region of said mask ROM cell array portion, and a via hole is not formed in an insulating layer upper than said bit line, either.

5. The method of manufacturing the semiconductor integrated circuit device according to claim 1, wherein during the manufacture of said mass-produced products, as a mask pattern for a mask used for forming said via hole for use in data writing, a mask pattern which is substantially the same as a mask pattern used for forming a via hole for use in data writing of said samples or said prototypes is used.

6. The method of manufacturing the semiconductor integrated circuit device according to claim 5, wherein during the manufacture of said mass-produced products, as a mask pattern for a mask used for forming said bit line, a mask pattern which is substantially the same as a mask pattern used for forming a bit line of said samples or said prototypes is used.

7. A method for providing a semiconductor integrated circuit device having a mask ROM cell array portion, wherein data to be stored in said mask ROM cell array is determined by connecting or disconnecting a memory cell transistor to a bit line through a via hole, the method comprising the steps of:

fabricating a sample or a prototype of said semiconductor integrated circuit with a bit line of a mask ROM cell array being formed by a first interconnection layer upper than a lowermost layer among a plurality of interconnection layers and with a via hole for determining data to be stored in the mask ROM cell array of said sample or said prototype being formed in an insulating layer below said first interconnection layer;

preparing a mask for manufacturing a mass-produced product of said semiconductor integrated circuit based on a mask used for fabricating said sample or said prototype; and manufacturing said mass-produced product using said mask for manufacturing a mass-produced product, with a bit line of a mask ROM cell array being formed by a second interconnection layer lower than said first interconnection layer among said plurality of interconnection layers and with a via hole for determining data to be stored in the mask ROM cell array of said mass-produced product being formed in an insulating layer below said second interconnection layer, the mask ROM cell array of said mass-produced product having a same memory cell transistor as the mask ROM cell array of said sample or said prototype.

* * * * *